(12) United States Patent
Vainsencher

(10) Patent No.: US 7,659,778 B2
(45) Date of Patent: Feb. 9, 2010

(54) APPARATUS AND METHOD FOR CLASS D AMPLIFIER WITH SAMPLING RATE CONVERSION

(75) Inventor: Leonardo Vainsencher, Tel-Aviv (IL)

(73) Assignee: Zoran Corporation, Sunnyvale, CA (US)

( * ) Notice: Subject to any disclaimer, the term of this patent is extended or adjusted under 35 U.S.C. 154(b) by 42 days.

(21) Appl. No.: 12/186,232

(22) Filed: Aug. 5, 2008

(65) Prior Publication Data

US 2009/0160552 A1 Jun. 25, 2009

Related U.S. Application Data

(60) Provisional application No. 61/016,199, filed on Dec. 21, 2007.

(51) Int. Cl.
*H03F 3/38* (2006.01)
(52) U.S. Cl. .......................................................... 330/10
(58) Field of Classification Search .................. 330/10, 330/207 A, 251; 375/238, 239; 341/143
See application file for complete search history.

(56) References Cited

U.S. PATENT DOCUMENTS

| | | | |
|---|---|---|---|
| 6,430,220 B1 | 8/2002 | Determan | |
| 6,586,991 B2 * | 7/2003 | Masuda et al. ................. | 330/10 |
| 6,657,566 B1 | 12/2003 | Risbo et al. | |
| 6,657,572 B2 | 12/2003 | Lee et al. | |
| 6,665,338 B1 | 12/2003 | Midya et al. | |
| 7,061,415 B2 | 6/2006 | Magrath | |
| 7,170,360 B2 | 1/2007 | Braun | |
| 7,206,563 B1 | 4/2007 | Danielson et al. | |
| 7,209,002 B2 | 4/2007 | Ohkuri et al. | |
| 7,224,728 B2 | 5/2007 | Komamura | |
| 2005/0110667 A1 | 5/2005 | Borisavljevic | |
| 2005/0285670 A1 | 12/2005 | Ohkuri et al. | |
| 2006/0034365 A1 | 2/2006 | Song et al. | |
| 2006/0072657 A1 | 4/2006 | Putzeys | |

OTHER PUBLICATIONS

Pascual, C. et al., "High-Fidelity PWM Inverter for Audio Amplification Based On Real-Time DSP," University of Illinois, Jun. 19, 2002, pp. 1-32.
Hawksford, M. "Modulation and System Techniques in PWM and SDM Switching Amplifiers," J. Audio Eng. Soc., vol. 54, No. 3, Mar. 3, 2006, pp. 107-139.
Hawksford, M. O. J., "Time-Quantized Frequency Modulation, Time-Domain Dither, Dispersive codes, and Parametrically Controlled Noise Shaping in SDM," J. Audio Eng. Soc., vol. 52, Jun. 6, 2004, pp. 587-617.
Trehan, C., "High Performance Class-D Amplifiers," Texas Tech University, May 2007, pp. 1-152.
Kiss, Peter et al., "Stable High-Order Delta-Sigma Digital-to-Analog Converters," IEEE Transactions on Circuits and Systems: Regular Papers, vol. 51, No. 1, Jan. 2004, pp. 200-205.

* cited by examiner

*Primary Examiner*—Robert Pascal
*Assistant Examiner*—Khiem D Nguyen
(74) *Attorney, Agent, or Firm*—Darby & Darby PC; John W. Branch

(57) ABSTRACT

A class D amplifier is provided. The class D amplifier includes an interpolator, a sampling rate converter, a pulse width modulator, a sigma-delta modulator, and a pulse width modulation (PWM) pulse generator (PPG). The sampling rate converter interpolates the output of the interpolator such that the sampling rate converter up-samples the interpolator output by a factor that is greater than one and less than two. The pulse width modulator outputs a multi-bit digital signal. The sigma-delta modulator performs sigma-delta modulation on the pulse width modulator output, the order of the sigma-delta modulation is programmable, and the output of the sigma-delta modulator is a multi-bit, digital signal. At least one of the orders to which the sigma-delta modulator can be programmed is greater than two. The PPG provides a pulse signal such that the width of each pulse is based on the value of the sigma-delta modulator output.

20 Claims, 13 Drawing Sheets

APPARATUS AND METHOD FOR CLASS D AMPLIFIER WITH SAMPLING RATE CONVERSION

CROSS-REFERENCE TO RELATED APPLICATIONS

The present invention is related to, and claims the benefit of U.S. Provisional Patent Application No. 61/016,199, filed on Dec. 21, 2007, and incorporated herein in its entirety by reference.

FIELD OF THE INVENTION

The invention is related to class D amplifiers, and in particular but not exclusively, to a method and circuit for a class D amplifier with sampling rate conversion.

BACKGROUND OF THE INVENTION

Prior art Class D amplifier Control Units (CDCUs), require the use of stable, low jitter system clocks. These clocks must provide low jitter clock signals, exactly matching the digital audio input signal's digital sampling rate over time and temperature, in order for the CDCU to produce Pulse Width Modulated (PWM) signals that can be efficiently, and inexpensively, converted to analog output signals exhibiting acceptably low noise and distortion characteristics. In particular, spurious tones appear in the analog output signal when systems clocks are employed that do not meet these criteria.

Today, in order to meet analog output signal noise and distortion requirements, Class-AB power amplifiers are predominantly used. These amplifiers are inefficient in terms of power consumption and die area. In some cases Class D amplifiers are used, but, as discussed above, these suffer from strict systems requirements that result in high cost integrated circuit implementations, and require complex, lengthy and costly calibration procedures to be employed at the time of systems manufacture, in order to meet acceptable noise and distortion limits. Sometimes these Class D amplifier prior art solutions cannot meet acceptable audio quality requirements, even after calibration.

BRIEF DESCRIPTION OF THE DRAWINGS

Non-limiting and non-exhaustive embodiments of the present invention are described with reference to the following drawings, in which.

DETAILED DESCRIPTION

Figure 1:
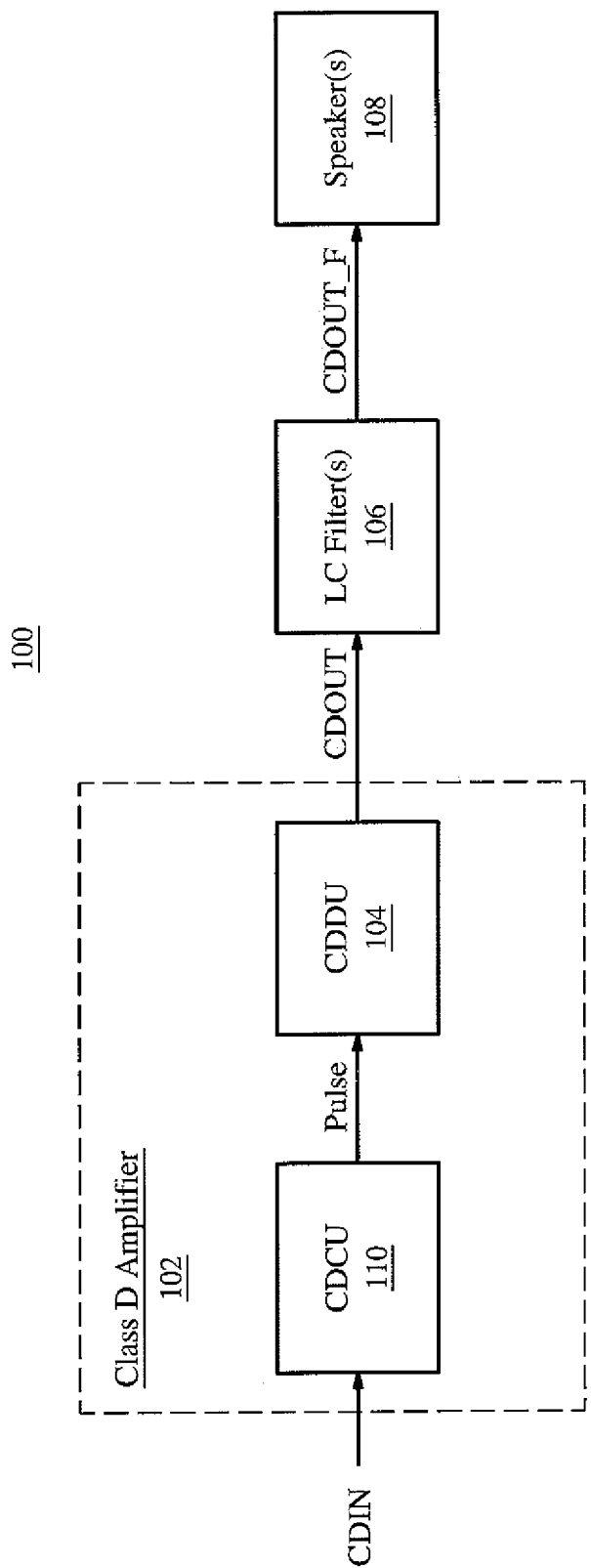
FIG. 1 shows a block diagram of an embodiment of a circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a class D amplifier that includes an interpolator, a pulse width modulator, a sigma-delta modulator, a pulse width modulation (PWM) pulse generator (PPG), and a sampling rate converter. The sampling rate converter interpolates the output of the interpolator such that the sampling rate converter up-samples the interpolator output by a factor that is greater than one and less than two. The pulse width modulator outputs a multi-bit digital signal. The sigma-delta modulator performs sigma-delta modulation on the pulse width modulator output, the order of the sigma-delta modulation is programmable, and the output of the sigma-delta modulator is a multi-bit, digital signal. At least one of the orders to which the sigma-delta modulator can be programmed is greater than two. The PPG provides a pulse signal such that the width of each pulse is based on the value of the sigma-delta modulator output.

FIG. 1 shows a block diagram of an embodiment of circuit 100. Circuit 100 includes speaker(s) 108, LC filter (s) 106, and class D amplifier 102. Class D amplifier 102 includes class D driving unit (CDDU) 104 and class D control unit (CDCU) 110. The terms "class D control unit" and "class D amplifier controller" are used interchangeably herein.

A number of different configurations known in the art may be used, such as monophonic, stereophonic, differential speaker, single-ended stereo output, single-ended lineout, and stereo lineout. Generally speaking, only one channel is shown herein. However, where only one channel is shown, it is understood that an additional channel may be added, for example for stereo mode.

Speaker 108 may include a single speaker, two speakers for stereo output, more than two speakers for multi-channel output, and/or the like. In one embodiment, speakers 108 include two headphone speakers for a stereo headphone output, as well as an additional speaker with a monophonic output.

LC filter(s) 106 includes one or more output LC filters for low-pass filtering of class D output signal CDOUT.

Additionally, CDDU 104 is a class D output stage that includes drivers and power switches. CDCU 110 is arranged to convert class D input signal CDIN into pulse signal Pulse, such that signal Pulse has a sequence of pulses whose average value is proportional to the amplitude of the audio signal at that time. Further, class D input signal CDIN may be a sampled audio signal, such a pulse-code modulated audio signal, in which "proportional to the audio signal" refers to the audio signal that was sampled.

Figure 2:
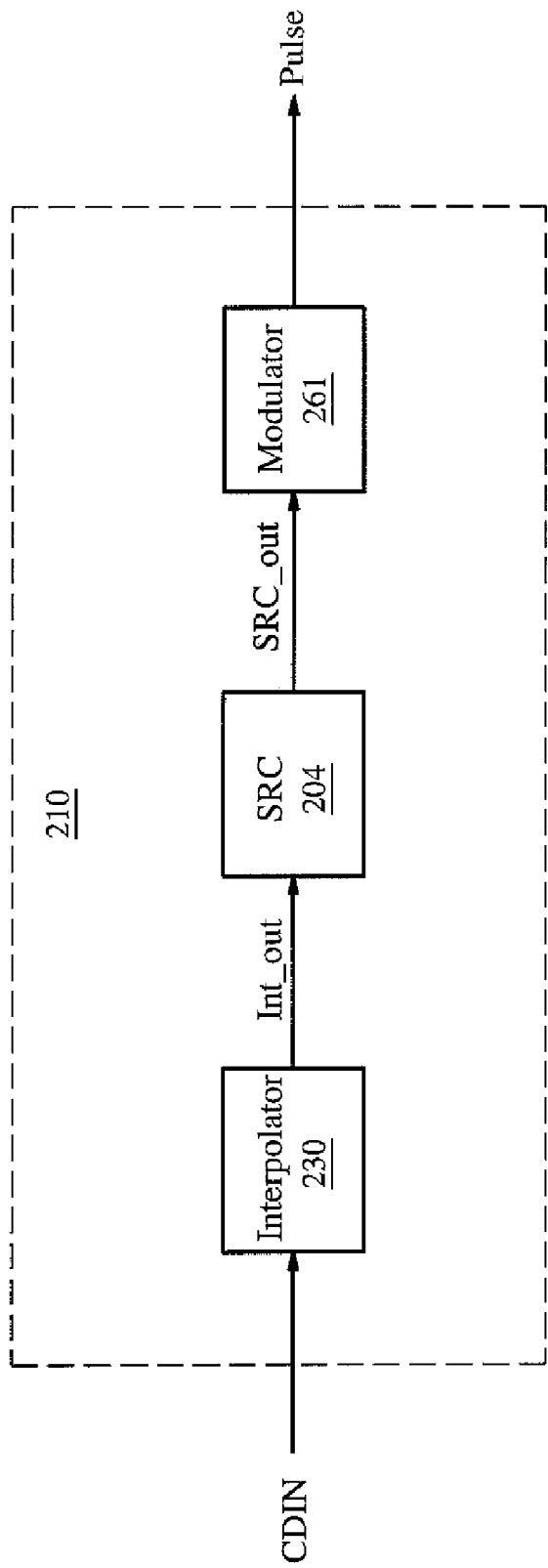
FIG. 2 illustrates a block diagram of an embodiment of the CDCU of FIG. 1.
Figure 3:
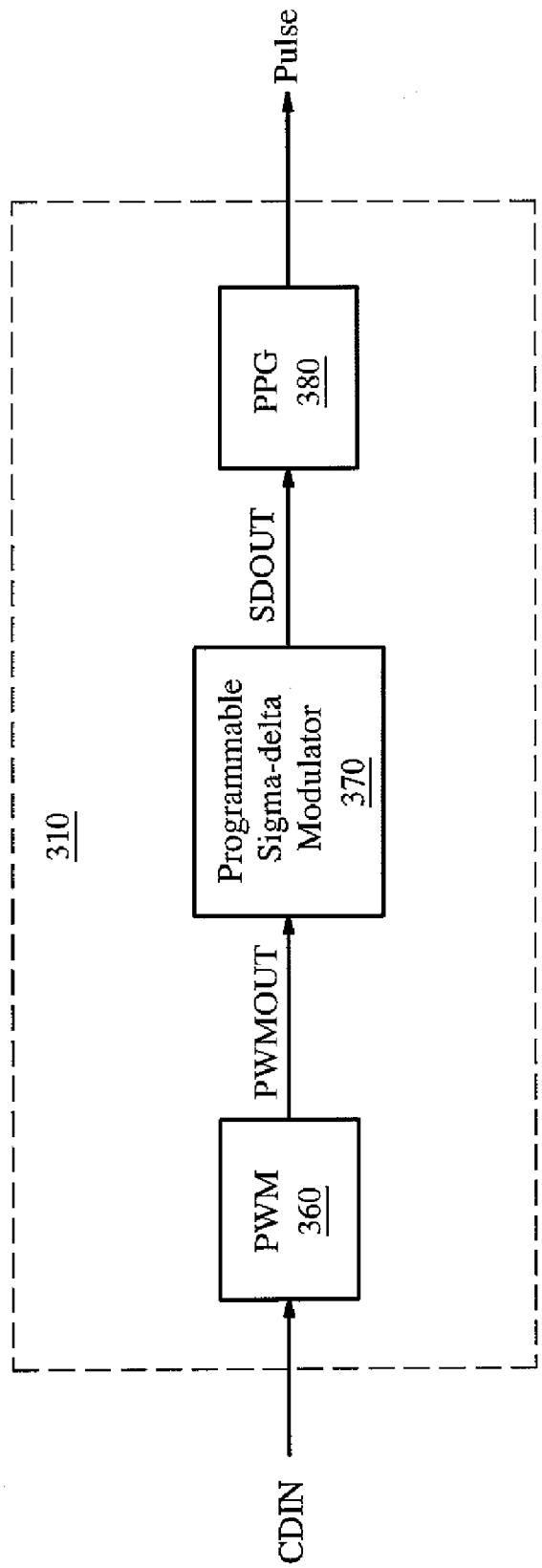
FIG. 3 shows a block diagram of another embodiment of the CDCU of FIG. 1.
Figure 4:
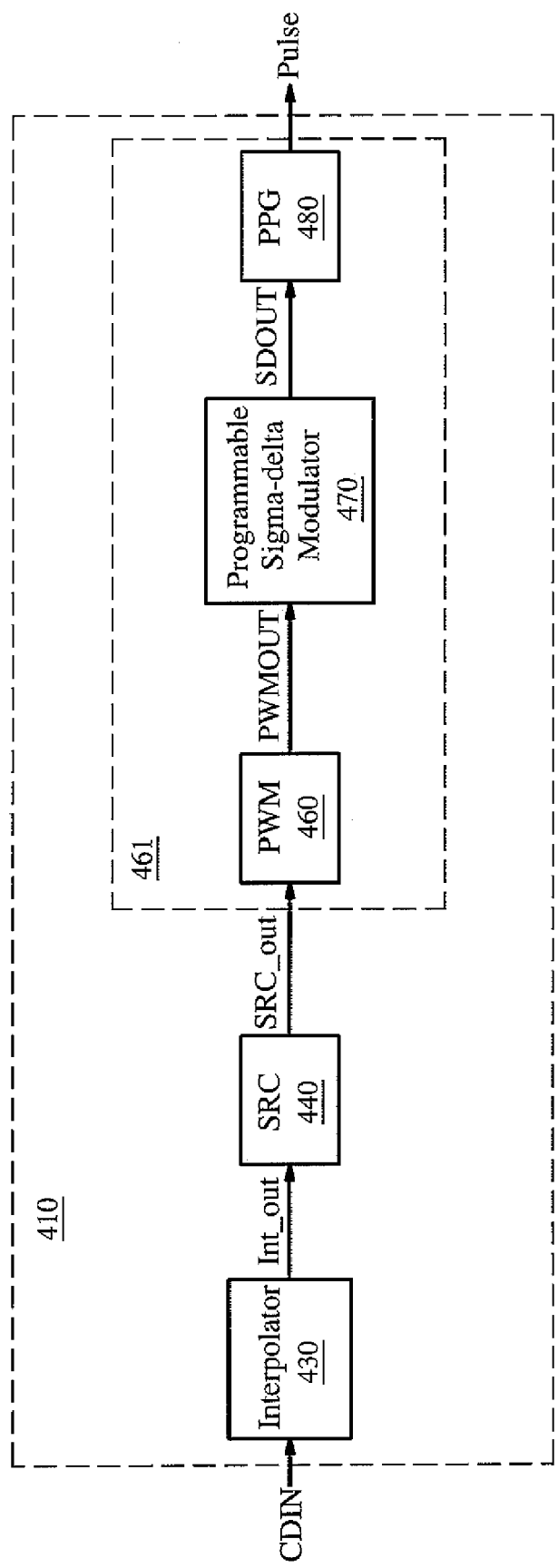
FIG. 4 illustrates a block diagram of an embodiment of the CDCU of FIG. 2.

In one embodiment, (as shown in FIG. 2 in one example), CDCU 110 includes a sampling rate converter that up-samples its input by a factor that is greater than one and less than two. In another embodiment (as shown in FIG. 3 in one example), CDCU 110 includes a programmable sigma-delta modulator. In yet another embodiment (as shown in FIG. 4 in one example), CDCU 110 includes both a sampling rate converter and a programmable sigma-delta modulator.

FIG. 2 illustrates a block diagram of an embodiment of the CDCU 210, which may be employed as an embodiment of CDCU 110 of FIG. 1. CDCU 210 includes interpolator 230, sampling rate converter (SRC) 240, and modulator 261.

For the embodiment illustrated in FIG. 2, class D input signal CDIN is a sampled audio signal. Interpolator 230 is arranged to interpolate signal CDIN by an integral amount that is greater than one to provide interpolator output signal Int_out. For example, in one embodiment, signal Int_out has a sampling rate that eight times greater than that of class D input signal CDIN, although the invention is not so limited. In some embodiments, the order of interpolation is programmable.

SRC 240 is arranged to interpolate signal Int_out to provide SRC output signal SRC_out such that signal SRC_out is interpolated by a factor that is greater than 1 and less than 2, for example 1.0055. In one embodiment, the factor is L/M, where L and M are integers.

Modulator 261 is arranged to modulate signal SRC_out to provide signal Pulse. In one embodiment, class D input signal CDIN is a sampled audio signal, and signal SRC_out is a sampling of the same audio signal, but with a different sampling rate. Further, modulator 261 is arranged to provide signal Pulse such that signal Pulse is a sequence of pulses whose average value is proportional to the amplitude of the audio signal at that time. In one embodiment, modulator 261 includes a pulse width modulator and a sigma-delta modulator.

FIG. 3 shows a block diagram of an embodiment of CDCU 310, which may be employed as an embodiment of CDCU 110 of FIG. 1. CDCU 310 includes PWM Pulse Generator (PPG) 380, programmable sigma-delta modulator 370, and pulse width modulator (PWM) 360.

Pulse width modulator 360 is arranged to perform pulse width modulation on signal CDIN to provide pulse width modulation output signal PWMOUT. Signal PWMOUT is a multi-bit digital signal. For example, signal PWMOUT may contain 16 or more bits in some embodiments. The value of the digital signal represents the pulse width of a pulse that would be a pulse-width modulated version of signal CDIN. Pulse width modulator 360 does not actually perform pulse width modulation in the sense of actually providing the pulse itself. Rather, pulse width modulator 360 computes the pulse width that that the pulse should have, and signal PWMOUT digitally indicates what the pulse width should be for each pulse. For example, in one embodiment, signal PWMOUT is a pulse-code modulated (PCM) signal, for which PCM-to-PWM conversion would still need to be performed in order to generate a PWM signal.

Programmable sigma-delta modulator 370 is arranged to provide signal SDOUT by performing sigma-delta modulation on signal PWMOUT. The sigma-delta modulation provides coarse quantization of input samples. Signals SDOUT and PWMOUT are both multi-bit, digital signals. Additionally, the order of the sigma-delta modulation is programmable. The possible order to which the sigma-delta modulation may be programmed is different in different embodiments. In one embodiment, the order is programmable from a range of first-order sigma-delta modulation to sixth-order sigma-delta modulation.

PPG 380 is arranged to provide pulse signal Pulse from signal SDOUT. Signal Pulse is a sequence of pulses, where each pulse has a width indicated by signal SDOUT.

FIG. 4 illustrates a block diagram of an embodiment of CDCU 410, which may be employed as an embodiment of CDCU 210 of FIG. 2. Modulator 461 includes pulse width modulator (PWM) 460, programmable sigma-delta modulator 470, and PPG 480. Pulse width modulator 460, programmable sigma-delta modulator 470, and PPG 480 Parts in CDCU 410 operate in a substantially similar manner as similarly-named parts in CDCU 310 of FIG. 3, except that pulse-width modulator 460 performs pulse-width modulation on signal SRC_out rather than signal CDIN.

In some embodiments, the order (OSR) of interpolator 430 is programmable, and is linked to the pulse width modulation rate employed by pulse width modulator 460. For example, in one embodiment, interpolator 430 is programmable for values of ×8, ×12, ×16, ×24, ×32, and ×48 in order to support a wide range of audio sampling rates (Fs). Additionally, in some embodiments, the number of audio output bits is programmable.

Figure 5:
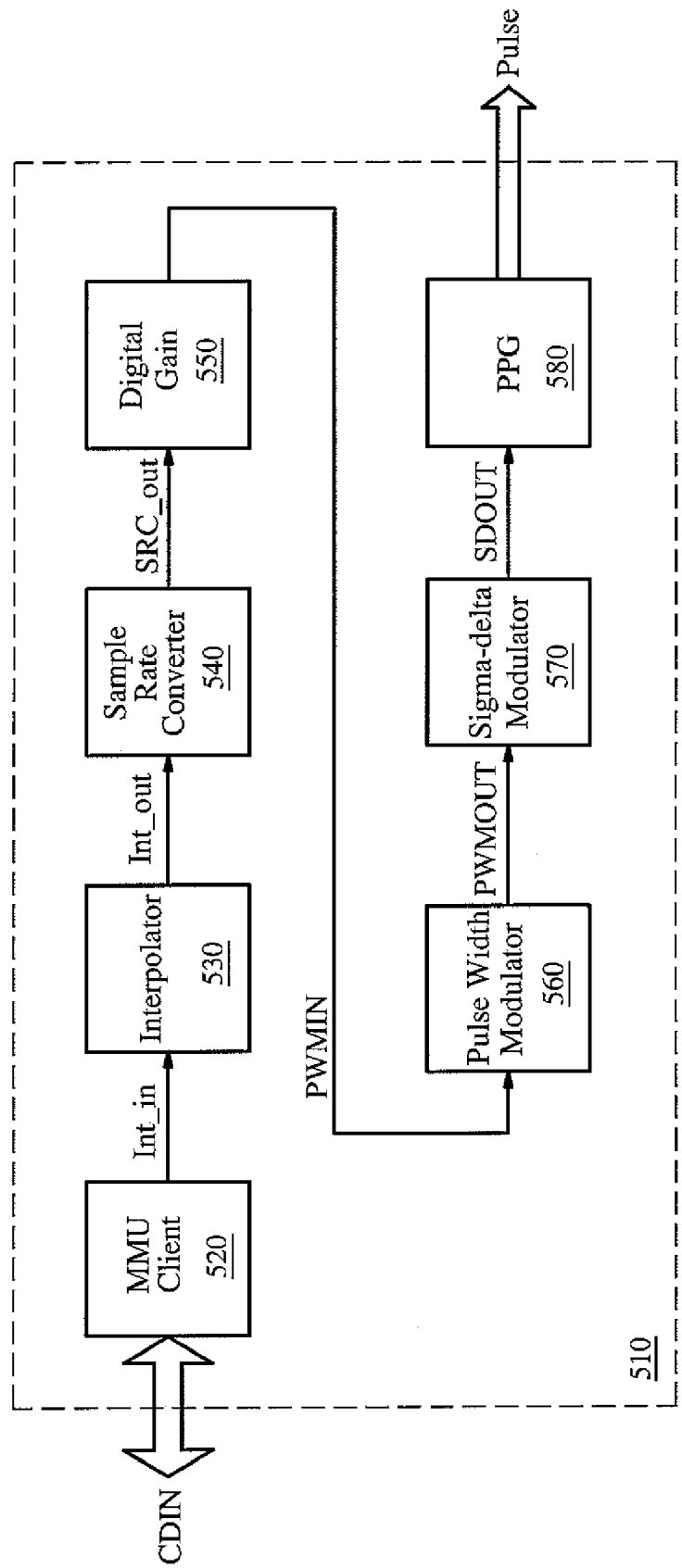
FIG. 5 shows a block diagram of an embodiment of the CDCU of FIG. 4.

Although a particular embodiment of CDCU 410 is shown, many variations of the illustrated circuit are contemplated. For example, there may be more circuits than those shown, performing various functions or the like before, after, or in between various blocks shown in FIG. 4. For example, although FIG. 4 shows that pulse width modulator 460 receives signal SRC_out and performs pulse width modulation on signal SRC_out, in other embodiments, as illustrated in FIG. 5 below in one example, digital gain is first applied to signal SRC_out, and the digitally gained version of signal SRC_OUT is the signal that is pulse width modulated by pulse width modulator 460. Similarly, in some embodiments, rather than interpolator 430 receiving signal CDIN directly, pre-processing functions may first be performed, and the pre-processed signal is received by interpolator 430. These variations and others are within the scope and spirit of the invention.

FIG. 5 shows a block diagram of an embodiment of CDCU 510, which may be employed as an embodiment of CDCU 410 of FIG. 4. CDCU 510 further includes memory management unit (MMU) client 520 and digital gain block 550.

In one embodiment, the audio output characteristics of the CDCU 510 are optimized at the time of systems test and calibration. In one embodiment, feedback from the class D driver is not employed. However, even though such a feedback loop is not employed in this embodiment, the optimization at the time of systems test and calibration incorporates the levels of spurious tones, Total Harmonic Distortion (THU) and Signal To Noise Ratio (SNR) presented to CDDU 510, as well as the characteristics of the CDDU, since the measurement of these output audio specifications are made after the signal CDDU is converted by a CDDU to analog audio signals, suitable to drive a speaker or headphones, so that the characteristics of the CDDU employed are also taken into consideration when calibrating CDCU 510.

The relationships between the digital parameter elements that are selected at time of Class D amplifier System's Test and calibration are quite complex. However, all have known effect on final output audio quality. Thus, their optimum values can be chosen at the time of systems test and calibration, by measuring THD, SNR, and spurious tones.

As one example of optimization at test, the programmable parameters of SRC 540 can be used to tune spurious tones so they are moved to outside of audio frequency band. By looking at the output audio spectrum, one can clearly see tones if they exist. Where they fall in the frequency spectrum depends on the actual sample rate conversion ratio. Thus, these spurious tones can be placed outside of the audio frequency band by slightly adjusting the sample rate conversion ratio. Generally, the ratio is a number very close to 1. If it is slightly changed some other parameters should be adjusted in order to compensate for the change in playback frequency that will be introduced. In some embodiments, these parameters are the width, and therefore number, of the PWM time slots and the playback frequency fixed clock divider. Changing the number of PWM time slots provides control with greater resolution, as compared with changing the clock divider, which provides coarser adjustment steps. In some embodiments, a significant benefit is obtained by linking SRC 540 programmability with these other programmable parameters, in order to allow SRC 540 to be adjusted, and spurious tones to be minimized, while the output playback frequency is automatically maintained. Similar relationships exist between other programmable parameters that can also be used to advantage.

In one embodiment, the CDCU works with 2 clock sources

Digital processing clock (GCLOCK)

Audio master clock (AMCLOCK)

In one embodiment, a high-speed clock (HCLOCK) is derived from a high-speed phase-locked loop (PLL), GLOCK is derived from HCLOCK by a clock divider (not shown), and AMCLOCK is derived from HCLOCK by another clock divider (not shown). Additionally, CDCLOCK, a gated version of AMCLOCK, may be fed to the CDDU (e.g. CDDU 104 of FIG. 1) to latch signals received from CDCU 510. In some embodiments, all processing blocks work based on GCLOCK only. The pulse generator unit (PPG) works with both clocks. The frequency AMCLOCK is determined based on CDCU parameters, according to the following formula in some embodiments:

$$F_{amclock} = F_s \times OSR \times SD_{qsteps} \times \frac{L}{M},$$

where Fs is the audio sampling frequency (e.g. 32, 44.1 or 48 KHz); OSR is the over-sampling ratio of interpolator 530; and $SD_{qsteps}$ is the number of sigma-delta output quantization steps. L and M are integers, and L/M is the factor by which sample rate converter 540 interpolates.

Example: for $F_s$=48 KHz; OSR=8; $SD_{qstep}$=280; L=225; M=224→$F_{amclock}$=108 MHz.

In some embodiments of the invention, sigma-delta quantization for coarse quantization is not performed (e.g. in some embodiments of CDCU 210 of FIG. 2 above), in which case the factors $SD_{qsteps}$ is omitted from the above equation. Also, in embodiments in which interpolator 530 is omitted, then the factor OSR is omitted from the above equation.

AMCLOCK is preferably derived from a low jitter clock source (PLL). Jitter greater than 0.2 ns may cause the appearance of spurious tones and raise the noise floor to levels unsuitable for audio applications.

$F_s$, L, M and OSR determine the PWM repetition rate $$F_p = F_s \times OSR \times \frac{L}{M}.$$

The number of PWM slots (number of possible pulse widths) is determined by the number of sigma-delta quantization steps, $N_{slots}=SD_{qsteps}$. $N_{slots}$ determines the PWM pulse-width resolution.

MMU client 520 is an interface to access memory that stores the sampled audio signal. Additionally, interpolator 530 requests more samples from MMU client 520 when more samples are needed, and MMU client 520 in turn requests the samples from a buffer in the memory that is outside of CDCU 510.

Interpolator 530 up-samples interpolator input signal Int_in to provide signal Int_out. For example, in one embodiment, signal Int_out is up-sampled by 8 relative to signal Int_out (i.e., the over-sampling ration OSR is 8 in this embodiment). In some embodiments, the OSR is programmable. In one embodiment, the interpolation is accomplished first by over-sampling with zero-stuffing, following by digital low-pass filtering. In other embodiments, the functionality of zero-stuffing and digital low-pass filtering is accomplished in one step. In one embodiment, interpolation with an OSR of eight is accomplished with three interpolators, each having an OSR of 2 (for a combined OSR of 8), and each filter being a type $I^2$ equiripple Finite Input Response (FIR) filter. In this embodiment, there are three stages, each stage having an interpolator with an OSR of 2. In other embodiments, there may be more or less stages. Also, in some embodiments, there may be more than one FIR, each having a different OSR, with the output of each FIR going to a multiplexer, so that the OSR of the interpolator is programmable.

Digital gain block 550 is arranged to provide programmable digital gain to signal SRC_out to provide PWM signal PWMIN. Digital gain block 550 provides digital gain to scale the audio samples. In some embodiments, the gain is performed in decibel increments. Pulse width modulator 560 is arranged to provide signal PWMOUT from signal PWMIN.

Figure 6:
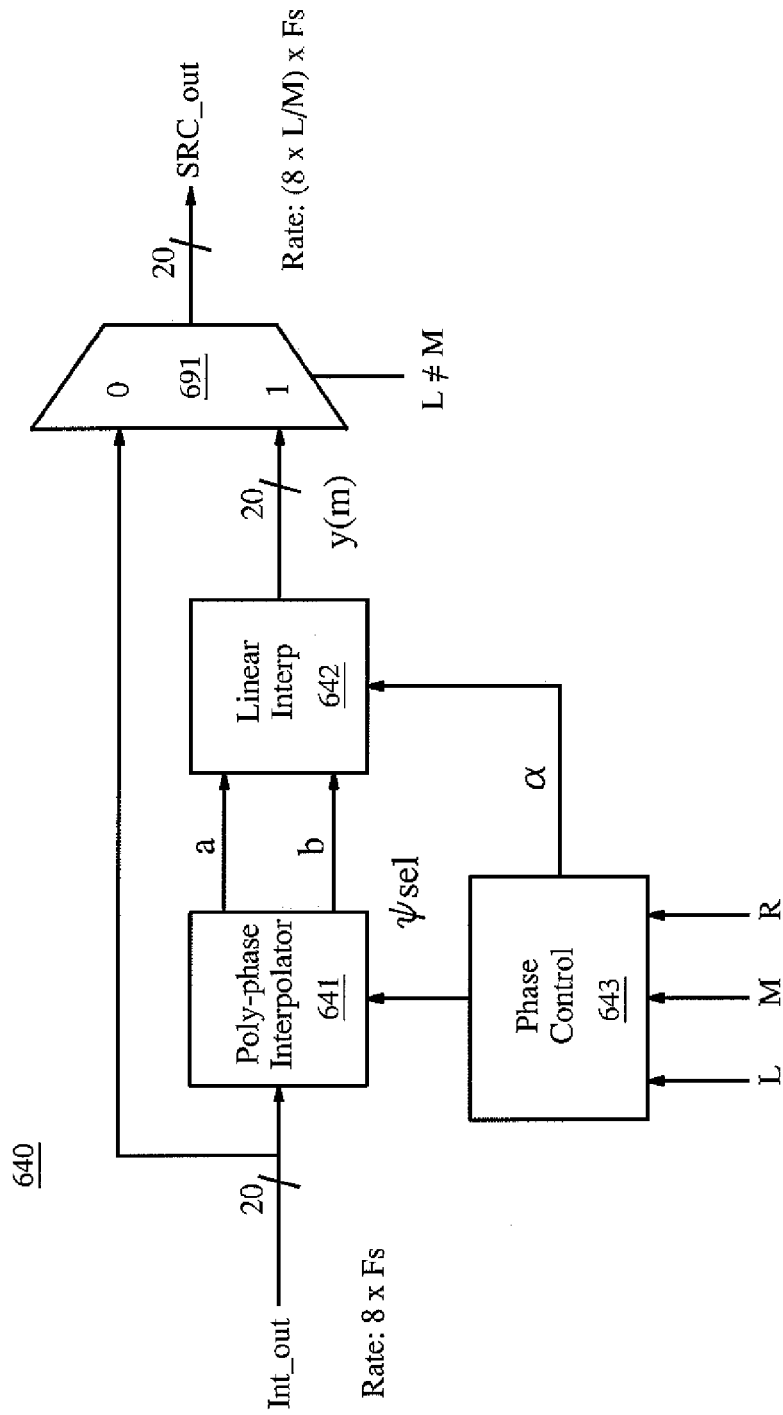
FIG. 6 illustrates a block diagram of an embodiment of the sample rate converter of FIG. 5.

FIG. 6 illustrates a block diagram of an embodiment of sample rate converter 640, which may be employed as an embodiment of sample rate converter 540 of FIG. 5. Sample rate converter (SRC) 640 includes poly-phase interpolator 641, linear interpolator 642, multiplexer 691, and phase control circuit 643. Multiplexer 691 is an optional component that need not be included in sample rate converter 640. Phase control circuit 643 is arranged to control poly-phase converter

641 and linear interpolator 642 such that linear interpolator 642 outputs signal y(m) such that the sampling rate of signal y(m) has a sampling rate that is greater than a sampling rate of interpolator output signal Int_out by a factor of L/M, where L and M are integers, and where $1 \leq L/M < 2$. In some embodiments, L and M are programmable.

In operation, SRC 640 is used to adjust the audio sampling rate to a realizable frequency. Poly-phase interpolator 641 is an interpolator, such as an 8× interpolator in one embodiment. However, rather than performing a full interpolation (such as the fall 8× interpolation), only two adjacent phases (a and b) are computed per output samples. The selection of which two adjacent phases are provided is determined by phase select signal φsel.

In most embodiments, it is contemplated that $L \neq M$ and $1 < L/M < 2$. However, in some embodiments, support for L=M may also be provided, for testing purposes, and/or for the unlikely case that the support for L=M is desired. In the embodiment shown, when L=M, multiplexer 691 is used to bypass SRC 640 so that signal Int_out is passed to the output. However, in ordinary operation, optional multiplexer 691 passes signal y(m) as the SRC output signal SRC_out.

Linear interpolator 642 is arranged to receive a, b, and interpolation factor signal α. Linear interpolator 642 is arranged to perform linear interpolation between a and b, so that y(m) is approximately given by y(m)=a+α*(b−a). Also, linear interpolator 642 may include rounding functions, clipping functions, and/or the like.

Additionally, phase control block 643 is arranged to provide signals φsel and a based, at least on part, on L, M, and R. L, M, and R may be fixed values or user-configurable values in various embodiments. They may be values in software, values stored in registers, provided by externals signals, and/or the like. Values L and M determine the amount of interpolation provided by SRC 640, since SRC 640 provides interpolation by L/M. In an embodiment in which interpolator 530 provides 8× interpolation, signal SRC_out has a sampling rate of (8*L/M)*Fs, where Fs is the sampling frequency of the audio signal. The parameter R=O/L, where O is the OSR of poly-phase interpolator 641. For example, in one embodiment, poly-phase interpolator 641 is an 8× interpolator (although, since only two output phases are taken for sample, it does not actually perform 8× interpolation as the output), and O is 8. In some embodiments, instead of passing R as a parameter, O itself may be passed as a parameter.

Phase control block 643 is arranged to provide signal φsel and a such that signal y(m) has a sampling rate that is L/M times that sampling rate of signal Int_out.

Effectively, SRC 640 performs interpolation by O (e.g. interpolation by 8) and then performs linear interpolation of adjacent interpolated samples to achieve interpolation by L/M. The interpolation by O is done first so that samples closer in time are obtained prior to the linear interpolation. However, poly-phase interpolator 641 only needs to calculate two output phases per sample to achieve this result, so that full interpolation by O is not actually performed-just two adjacent samples for each input samples is calculated rather than calculating all O samples.

In some embodiments, in order to determine the value for ax and φsel, phase control block 643 first calculates a parameter P. Input samples are available at times t=k*L (k=0, 1 . . . ). Output samples at times t=m*M (m=0, 1 . . . ). At any given time t=m*M: α=(t MODULO L)/L; out (t)=(1−α)*in (t1)+α*in(t1+L), where t1=(INTEGER(t/L))*L. The parameter P may be given by P=(t MODULO L). In one embodiment, for each new output sample to be provided, M is added to the previous value of P, and then modulo L is performed on the sum (the sum of the old P and M) to generate the new P. Because of the MODULO L, $0 \leq P < L$, and therefore $0 \leq P/L < 1$. In this embodiment, the quantity P/L is the normalized difference between the output sample time and the immediately preceding input sample time. If interpolation by O was not performed, then α would be P/L. However, since sampling by O is performed, a is the fractional part of O*P/L, and the integer part of O*P/L is φsel, because it indicates which two adjacent phases linear interpolation should be performed between. Accordingly, in one embodiment, phase control block 643 calculates α and φsel as follows: frac(P*R)=α, and int(P*R)=φsel.

Although FIG. 6 illustrates only one SRC, in some embodiments, for stereo applications two of the SRCs illustrated in FIG. 6 may be included, one for each channel.

Figure 7:
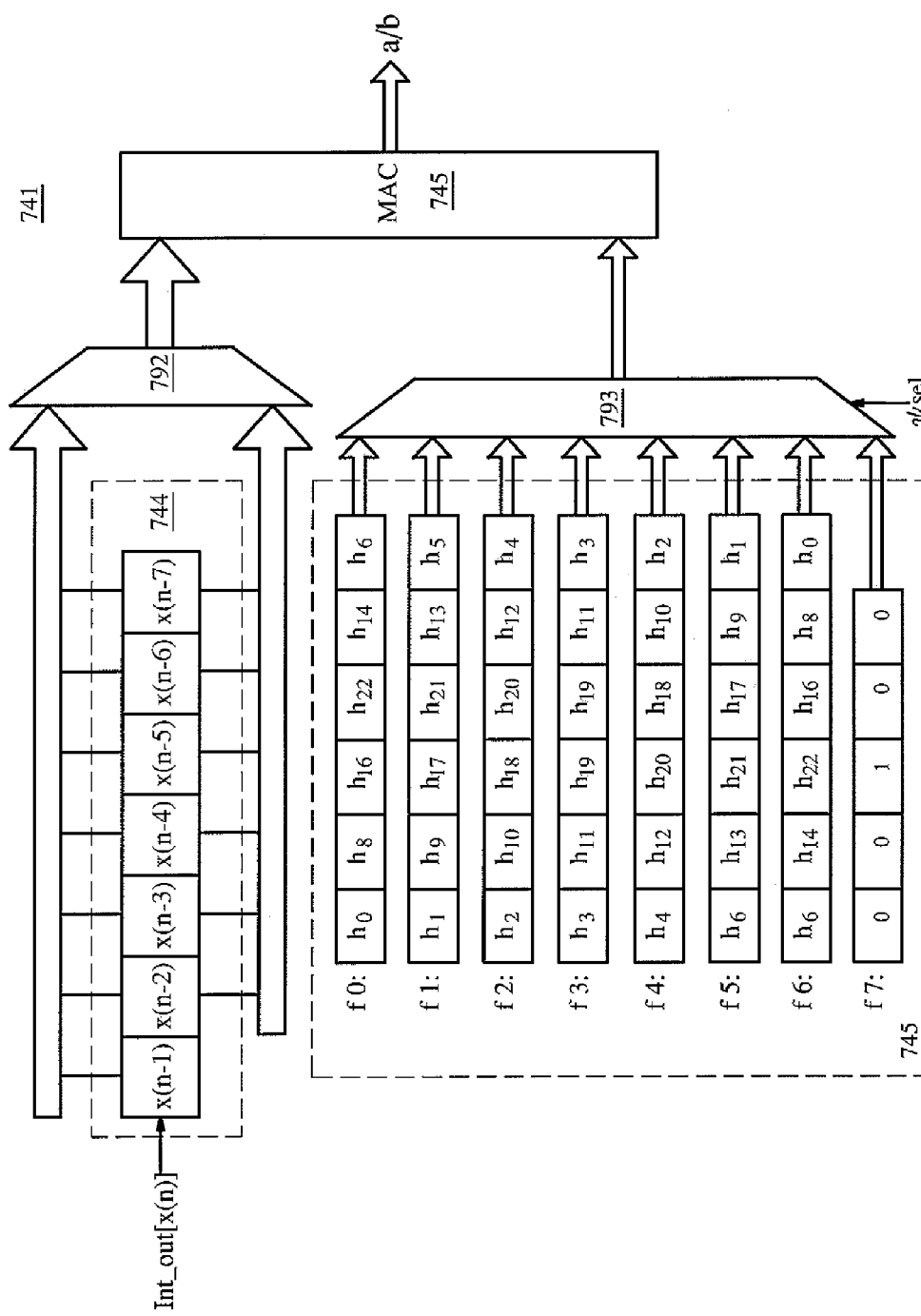
FIG. 7 illustrates a block diagram of an embodiment of the poly-phase converter of FIG. 6.

FIG. 7 illustrates a functional block diagram of an embodiment of poly-phase converter 741, which may be employed as an embodiment of poly-phase converter 641 of FIG. 6. Poly-phase converter 741 includes filter delay line 744, coefficients block 745, multiplexers 792 and 793, and multiply-accumulate (MAC) block 745.

In the embodiment illustrated, poly-phase filter 741 is a $5^{th}$ order Lagrange interpolator, with a filter length of 47, including 23 non-trivial ($\neq 0, \neq 1$) unique coefficients. In this embodiment, the filter has 8 sub-filter phases. However, the invention is not so limited, and other embodiments are within the scope and spirit of the invention.

Rather than computing all eight phases, two adjacent phases are computed per sample. The poly-phase interpolator outputs are computed from two adjacent sets of sub-filter coefficients. Output "a" is the "early" phase. Output "b" is the "late" phase. The early phase is computed each time from input samples x(n−2) thru x(n−7) stored in the filter delay line 744. Filter delay line 744 is a shift register. When the early phase is computed using the last filter phase, φ7, the late phase is computed using φ0 coefficients and input samples x(n−1) thru x(n−6) stored in the filter delay line 744. In each of the other cases, late phase is computed from input samples x(n−2) thru x(n−7).

For multiplexer 792, which of the two inputs is provided as the output is based on whether "a" or "b" is currently being calculated. For multiplexer 793, which of the 8 inputs is selected as the output depends on Easel. MAC block 745 performs a multiply-accumulate function on its inputs to provide a and b. In some embodiments, MAC 745 also stores the results temporarily, so that, for example, after "a" is calculated, the result may be stored and provided as an output while "b" is being calculated.

The determinations of optimal filter coefficients for equirriipple FIR filters (such as the coefficients in coefficients block 745) is discussed in greater detail below.

Figure 8:
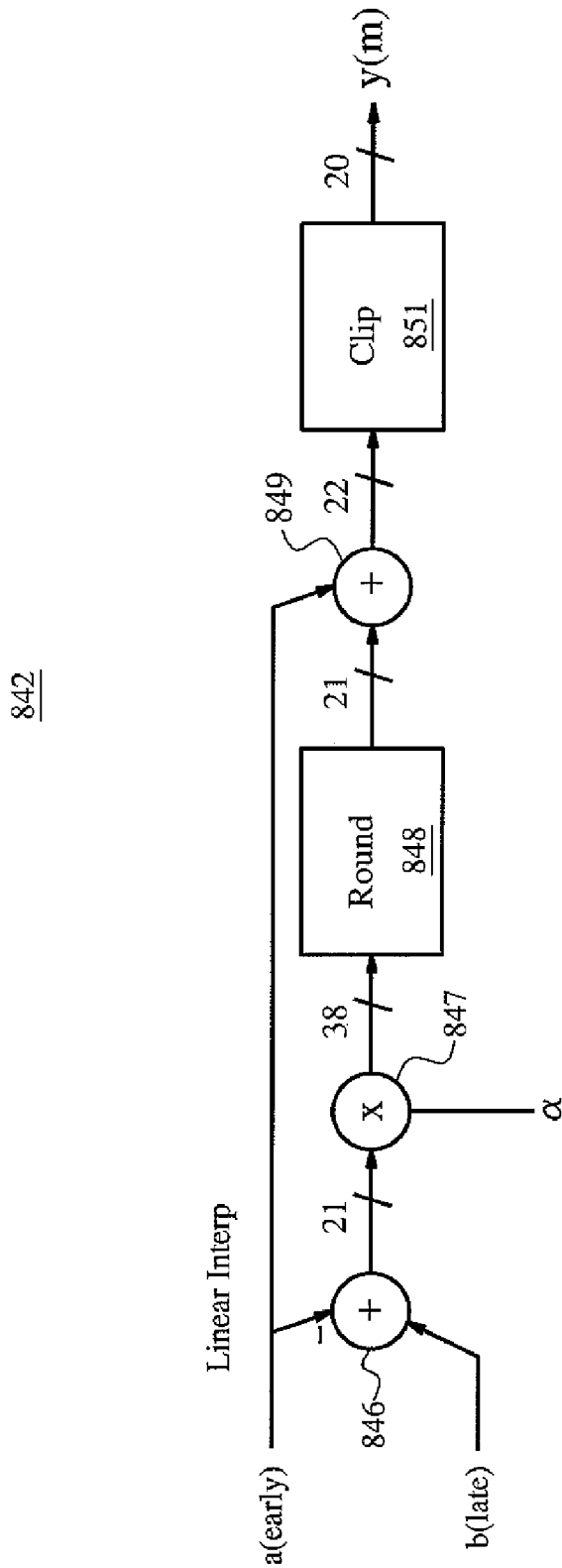
FIG. 8 shows a block diagram of an embodiment of the linear interpolator of FIG. 6.

FIG. 8 shows a functional block diagram of an embodiment of the linear interpolator 842, which may be employed as an embodiment of linear interpolator 640 of FIG. 6. Linear interpolator 842 includes adder 846, multiplier 847, rounding block 848, adder 849, and clipping block 851. The adder blocks perform addition, where the inputs are multi-bit digital signals each having a value, and the output is a multi-bit digital signal having a value that is a sum of the values of the input signals to the adder. Similarly, the multiplier block performs multiplication, where the inputs are multi-bit digital signals each having a value, and the output is a multi-bit digital signal having a value that is a product of the values of the input signals to the multiplier. Rounding block 848 provides an output by rounding the input, where output of rounding block 848 has fewer bits than the input. Further, clipping block 851 provides signal y(m) by rounding the input, and clamping (i.e., saturating) it so that less than the minimum possible value saturate to the minimum possible value at the output, and values greater than the greater possible value saturate to the maximum possible value.

Figure 9:
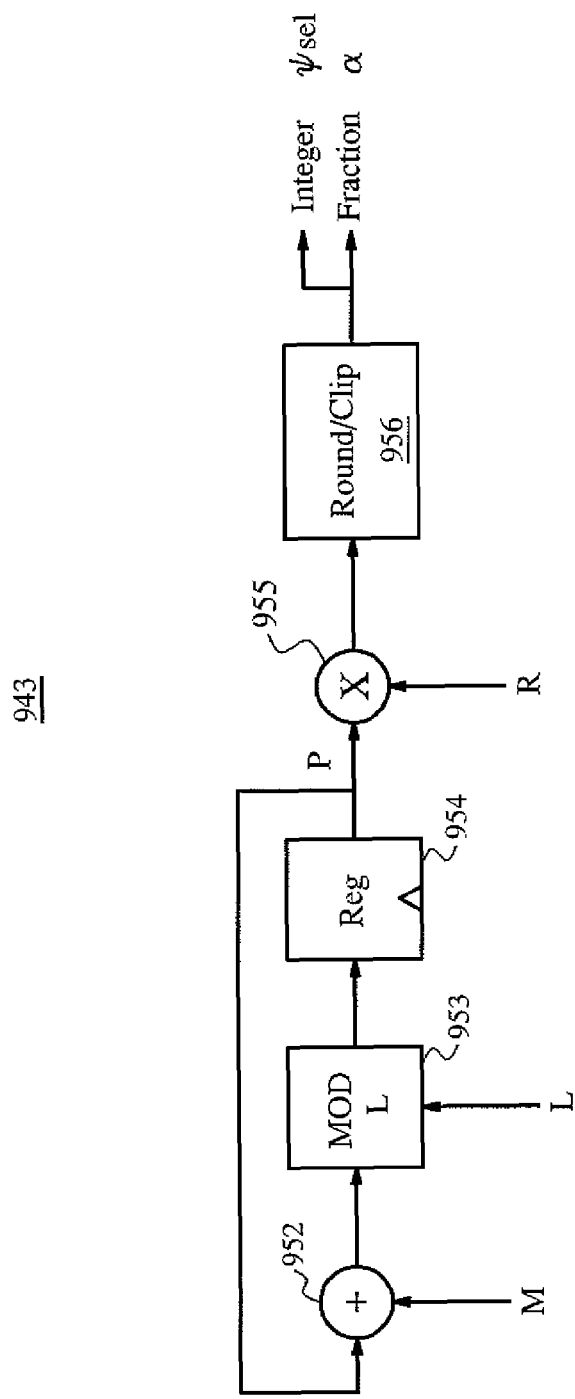
FIG. 9 illustrates a block diagram of an embodiment of the phase control block of FIG. 6.

FIG. 9 illustrates a functional block diagram of an embodiment of the phase control block 943, which may be employed as an embodiment of pulse control block 643 of FIG. 6.

In operation, phase control block 943 provides (via signal φsel) to the poly-phase interpolator (e.g. poly-phase 641 of FIG. 6) information about which phases to use to compute "a" and "b". Phase control block 943 also provides to the linear interpolator (e.g. linear 642 of FIG. 6) the interpolation coefficient α. In addition, phase control block 943 indicates (via signal φsel) to the poly-phase interpolator (e.g. 641) when to shift in a new sample into the filter delay line (e.g. filter delay line 744 of FIG. 7). A new sample must be available at the SRC input whenever P+M≧1.

In one embodiment, actual L, M, and R values come from parameters SRC_L, SRC_M and SRC_R, respectively, and actual programmed L and M are pre-scaled (left-shifted) such that LIM remains constant and L's most significant bit is 1. In this embodiment, actual programmed R is pre-computed as $2^{15}$/SRC_L, since SRC_L≧$2^{15}$, SRC_R≦1.0 (0x20000). The values of P are in the range 0≦P<L. The phase control register 954 is reset to 0 whenever the CDCU is disabled.

In one embodiment, based on the sum of filter coefficients absolute values, the SRC largest output is 1.4 times the input value. In one embodiment, the SRC max input rate is 768,000 samples/second. In this example, output rate can be up to 2 times the input rate but usually it is very close to (but higher then) the input rate.

Table 1 below contains typical SRC-related register settings for one embodiment. SD_QSTEPS2 is half of the number of sigma-delta quantization steps (e.g. sigma-delta modulator 570 of FIG. 5). (Many other sampling rates F(s) can be supported; Table 1 only shows a few examples). In this example, the number is halved to save bits, but in other embodiments, the actual number of sigma-delta quantization steps may be used instead. CGU is the clock division provided by a clock divider (not shown) that divides the frequency of signal HCLOCK by an integer.

The pulse width modulator described below describes one particular embodiment of a pulse width modulator. However, the invention is not so limited, and other embodiments are within the scope and spirit of the invention.

Pulse width modulator 1060 computes pulse widths based on audio samples. Pulse width modulator 1060 implements a first order natural-sampling approximation, according to the following formula:

$$w_k = \frac{x_k + x_{k-1}}{2.0 - (x_k - x_{k-1})}$$

Parameters $w_k$, $x_k$, $x_{k-1}$ are, respectively, the current pulse width, current audio sample, and previous audio sample. Values of $x_k$ are normalized in the range [-1.0, 1.0); Computed $w_k$ values are in the same range. That audio sample range results in the condition that $x_k - x_{k-1} < 2.0$, however when $x_k - x_{k-1}$ approaches 2.0, resulting pulse widths may vary considerably. This can be avoided by proper gain setting. A suitable working range for input samples is $|x_k| \leq 0.95$.

The formula is computed using long-division. The resulting quotient is a fixed point fraction, with quotient rounding to nearest is accomplished by inspection of the division remainder.

In one embodiment, maximum input/output data rate in this subunit is 2×48000×16=1,536K samples per second. At 162 MHz GCLOCK minimum speed, there are over 100 cycles available. This cycle count is sufficient to perform division operation using bit-by-bit algorithm.

The multiplexer allows for a bypass mode. In bypass mode operation corresponds to uniform sampling PWM mode. In bypass mode, input samples are transferred to the output unmodified.

Figure 11:
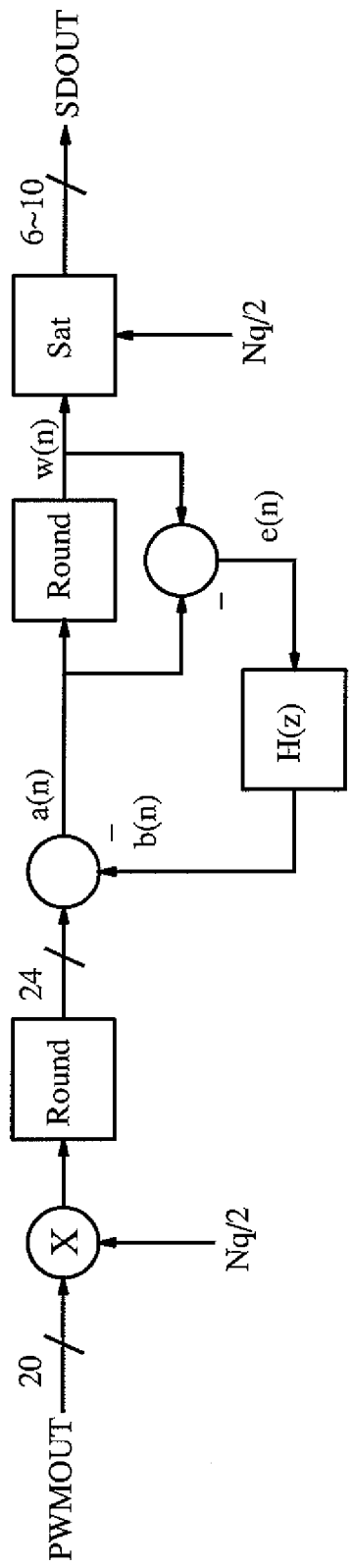
FIG. 11 illustrates a block diagram of an embodiment of the sigma-delta modulator of FIG. 5.

FIG. 11 illustrates a block diagram of an embodiment of the sigma-delta modulator 1170, which may be employed as an embodiment of sigma-delta modulator 570 of FIG. 5.

Sigma-delta modulation is employed to reduce quantization error when reducing the number of bits employed to drive the PPG (e.g. PPG 580 of FIG. 5). The sigma-delta modula-

TABLE 1

| | | | L, M & R parameter settings. | | | | |
|---|---|---|---|---|---|---|---|
| HCLOCK | Fs | CGU | INTERP_OSR | SD_QSTEPS2 | SRC_L | SRC_M | SRC_R |
| 648 MHz | 44.1 KHz | ÷7 | 0 | 8X | 131 | 45000 | 44933 | 95444 |
| | 22.05 | | 2 | 16X | | | | |
| | 11.025 | | 4 | 32X | | | | |
| | 48 KHz | ÷6 | 0 | 8X | 140 | 57600 | 57344 | 74565 |
| | 32 | | 1 | 12X | | | | |
| | 16 | | 3 | 24X | | | | |
| | 8 | | 5 | 48X | | | | |
| 972 MHz | 44.1 KHz | ÷10 | 0 | 8X | 137 | 54000 | 53704 | 79536 |
| | 22.05 | | 2 | 16X | | | | |
| | 11.025 | | 4 | 32X | | | | |
| | 48 KHz | ÷9 | 0 | 8X | 140 | 57600 | 57344 | 74565 |
| | 32 | | 1 | 12X | | | | |
| | 16 | | 3 | 24X | | | | |
| | 8 | | 5 | 48X | | | | |

Figure 10:
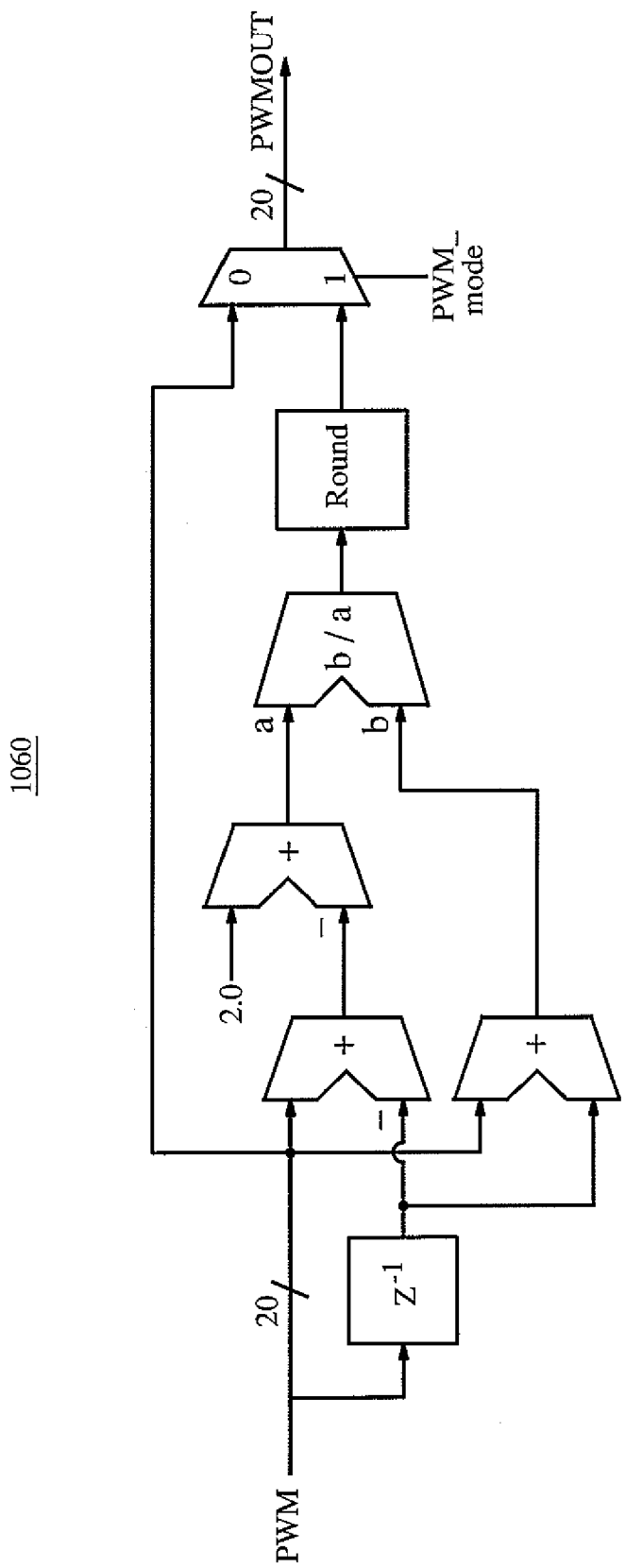
FIG. 10 shows a block diagram of an embodiment of the pulse width modulator of FIG. 5.

FIG. 10 shows a block diagram of an embodiment of pulse width modulator 1060, which may be employed as an embodiment of pulse width modulator 560 of FIG. 5. Signal PWM_mode is used to selectively enable or bypass pulse width modulation.

tion works by putting the quantization error from the conversion to a lower number of bits into a feedback loop. Since a feedback loop can function as a filter, by creating a feedback loop for the error itself, the error can be filtered out in the audio frequency band, the band of interest for Class D audio amplifiers, and placed at a higher spectral position, thus significantly reducing its effect on output audio quality. The simplest example of this process can be described by the following equation:

$$y(n)=x(n)-E(x(n-1))$$

where y is the outbound sample value, x is the inbound sample value, n is the sample number, and E(x) is the error between the original and quantized values. This formula can also be read: The outbound sample is equal to the inbound sample minus the error from the previous inbound sample. In some embodiments, more complex algorithms can be used, which use more samples of error worth of feedback, in order to create more complex "noise shaping" frequency response curves. In general, the more samples of error used, the higher the order of the sigma-delta loop, the more complex the sigma-delta loop operation, and the lower the quantization error in the frequency band of interest.

The implementation of one particular embodiment of sigma-delta modulator 1170 is described below. However, the invention is not so limited, and other implementations of the sigma-delta modulation are within the scope and spirit of the invention.

Sigma-delta modulator 1170 is responsible for producing coarse quantization version of input samples. In some embodiments, input samples are normalized in the range [−1.0, 1.0). In some embodiments, the number of quantization steps is programmable, and is identical to the number PWM slots. In some embodiments, the corresponding output precision is between 6 and 10 bits. The number of bits in signal SDOUT varies according to the loop order L of the sigma-delta modulation. In some embodiments, the implementation of the sigma-delta modulation is based on error feedback loop. The output range is $$-\frac{N_Q}{2} \le y(n) < \frac{N_Q}{2},$$

where $N_Q$ is the number of quantization steps. The SAT (saturate) block ensures output stays within range. In the event that the SAT input is outside range, an interrupt bit is set.

The transfer function $H(Z)=1-G(Z)$, where $G(z)$ has the form $$G(z) = 1 + \sum_{k=1}^{L} a_k \cdot z^{-k} = 1 + a_1 \cdot z^{-1} + a_2 \cdot z^{-2} + \ldots + a_L \cdot z^{-L}$$

The $z^0$ term has unity coefficient. In one embodiment, the loop order L is programmable in the range 0~6. Generally speaking, a loop order L somewhere between 2 and 5 will be optimal for most applications. A loop order L of 3 or 4 will frequently be optimal for a given application (optimal in terms of signal-to-noise ratio and other parameters). A loop order of 0 or 1 is primarily used for testing purposes. Zero-order loop means Y(n)=round[x(n)], that is, no feedback is applied. The shape of G(z) has high-pass characteristic. G(z) =$(1-z)^L$, an L-order differentiator, may be chosen as a simple approximation for a high-pass filter. In some embodiments, for L>2, G(z) can be either derived from differentiator high-pass approximation, or based on optimized high-pass filter design.

Based on the definitions above, $$H(z) = 1 - G(z)$$
$$= -\sum_{k=1}^{L} a_k \cdot z^{-k}$$
$$= -a_1 \cdot z^{-1} - a_2 \cdot z^{-2} - \ldots - a_L \cdot z^{-L}$$
$$H(z) = -z^{-1} \cdot (a_1 + a_2 \cdot z^{-1} + \ldots + a_L \cdot z^{-L+1})$$

Therefore, $h_0=0$ and $h_k=-\alpha_k$, for $1 \le k \le L$.

In this embodiment, the condition obits>L must be satisfied to ensure the loop is unconditionally stable, where ibits be the input bit precision and obits is the output bit precision. This is because H(z) can add up to L bits to e(n) whose width is ibits+1−obits, thus making b(n) width→ibits+1−obits+L. The assumption is that x(n) width is no less than b(n) width. Under this assumption, a(n) width is ibits+1 bits at most. Therefore, in this embodiment the circuit forces width{x(n)}≧width{b(n)} that is, ibits≧ibits+1−obits+L

⇒obits≧1+L

⇒obits>L

In one embodiment, the coefficients for H(z) based on optimal G(z) are as indicated in Table 2 below:

TABLE 2

H(z) coefficients based on optimal G(z).

| | L: | | | | | |
|---|---|---|---|---|---|---|
| | 1 | 2 | 3 | 4 | 5 | 6 |
| h(1) | n/a | n/a | 11891 | 15878 | 19827 | 23815 |
| h(2) | n/a | n/a | −11891 | −23571 | −39023 | −58433 |
| h(3) | n/a | n/a | 4096 | 15878 | 39023 | 77427 |
| h(4) | n/a | n/a | n/a | −4096 | −19827 | −58433 |
| h(5) | n/a | n/a | n/a | n/a | 4096 | 23815 |
| h(6) | n/a | n/a | n/a | n/a | n/a | −4096 |
| Normalization factor: | n/a | n/a | 4096 | 4096 | 4096 | 4096 |
| Σ\|h\| = | n/a | n/a | 6.8 | 14.5 | 29.7 | 60.1 |
| bits added: | n/a | n/a | 3 | 4 | 5 | 6 |

Various commercial filter design tools exist, which can produce filter coefficients that satisfy some optimization criteria, such as least-squares, equiripple, etc. One example is the Parks-McClellan design procedures for equiripple FIR filters, which is widely implemented by commercial tools, such as MATLAB. In MATLAB, the function firpm or remez, can quickly produce equiripple FIR coefficients, based on a desired number of taps (filter order) and a desired shape of the frequency response. These functions return the best linear phase FIR approximation of the desired shape in the minmax sense, for the desired filter order. MATLAB also provides a GUI-based filter design and analysis tool, through the command fdatool. Another tool example is OCTAVE, which also provides similar filter design capabilities.

FIG. 11 illustrates an error feedback sigma-delta loop. However, the invention is not so limited. For example, in other embodiments, an output-feedback loop may be employed. These embodiments and others are within the scope and spirit of the invention.

Figure 12:
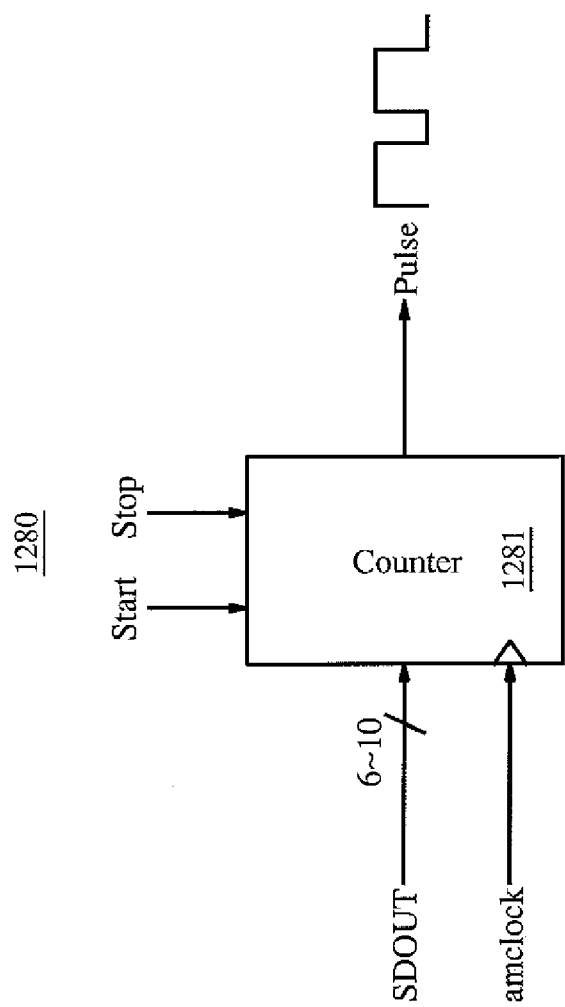
FIG. 12 shows a block diagram of an embodiment of the PWM pulse generator (PPG) of FIG. 5.

FIG. 12 shows a block diagram of an embodiment of PPG 1280, which may be employed as an embodiment of PPG 580 of FIG. 5. PPG 1280 includes counter 1281.

PPG 1280 is arranged to convert the PCM data stream of signal SDOUT into the pulse width modulated data (signal Pulse) used to drive the CDDU (e.g. CDDU 104 of FIG. 1).

In one embodiment, PPG 1280 is arranged to provide signal Pulse such that each pulse of signal Pulse has a pulse width that is proportional to the value of the corresponding audio sample in signal SDOUT. This is accomplished by leaving signal Pulse on for a number of clock cycles (of signal amclock) equal to the value of signal SDOUT, by counting clock cycles of signal amclock until they reach the value indicated by signal SDOUT.

The input bit width varies according the sigma-delta unit quantization steps, which also determines how many PWM slots there are in each PWM cycle. In one embodiment, the input value specifies the deviation from 50% duty-cycle, rather than having each input value specify proportionality to the pulse width. In this embodiment, negative values mean duty-cycles of less than 50% (positive pulse shorter than negative pulse), and positive values correspond to duty-cycles greater than 50% (positive pulse longer than negative pulse).

These modulation approaches and others are within the scope and spirit of the invention.

In one embodiment with two audio channels for stereo output, there are 2 independent pulse generators, one for each audio channel.

Figure 13:
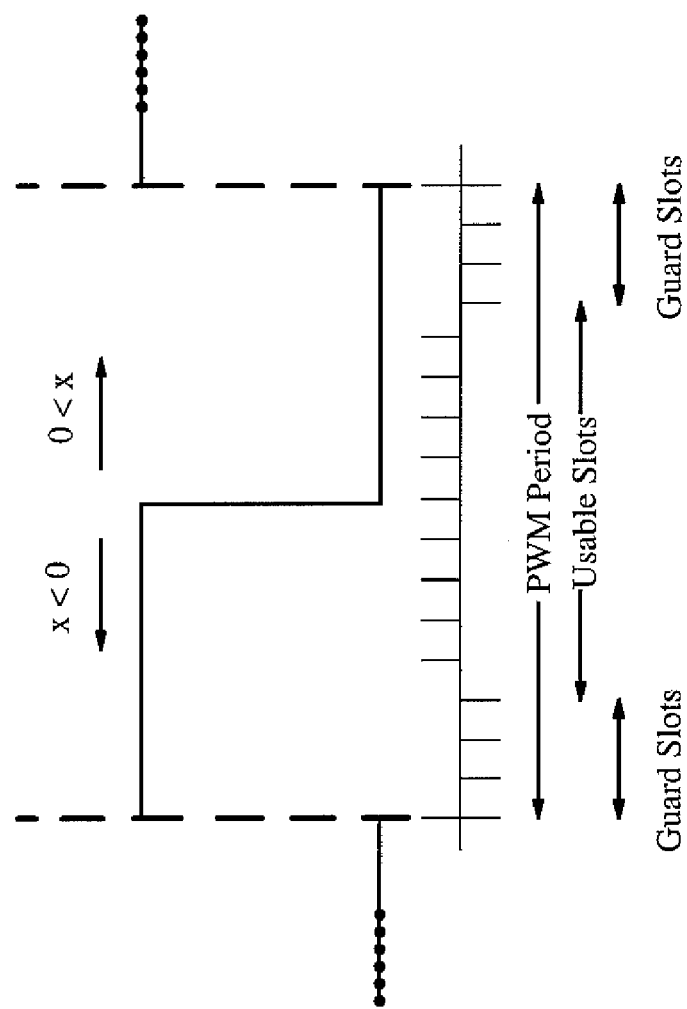
FIG. 13 illustrates a timing diagram of waveform an embodiment of a portion of signal Pulse of FIG. 12, in accordance with aspects of the present invention.

FIG. 13 illustrates a timing diagram of waveform an embodiment of a portion of signal Pulse for an embodiment of PPG 1280 of FIG. 12.

In the embodiment illustrated, PWM periods consist of guard slots and usable slots. The total number of guard slots is determined by the $PWM_{guard}$ parameter. The total number of slots is determined the $SD_{QSTEPS}$ parameter. The number of PWM usable slots may be calculated by $$N_{usable\_slots} = SD_{QSTEPS} - 2 \cdot PWM_{guard}$$

It is an error to attempt to produce pulse widths beyond the usable slots (positive pulses shorter than $PWM_{guard}$ or longer than $SD_{QSTEPs} - PWM_{guard}$). In one embodiment, In case of such an error, the PPG sets an interrupt bit and forces the pulse width within the usable slots limit.

In the illustrated embodiment, PPG 1280 expects one audio frame (one or two samples) every $N_{slots}/F_{amclock}$ seconds, where $F_{amclock}$ is the frequency of the audio master clock. In this embodiment, the maximum input data rate is 2×48000× 16=1,536K samples per second (highest PWM rate is 48000× 16=768 KHz). In one embodiment, the slot duration is approximately 10 ns.

PPG 1280 produces commands for the CDDU (e.g. CDDU 104 of FIG. 1). Commands are in the form of logic levels synchronized to the class-d clock (CDCLOCK) transmitted to the CDDU. In single-ended headphone mode each PPG controls one CDDU half-bridge. In differential mono mode, a single PPG can control 2 half-bridges.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for amplification, comprising:
    a class D controller that is arranged to receive a class D amplifier input signal and to provide a class D controller output signal, wherein the class D controller includes:
        an interpolator that is arranged to receive a digital signal, and to provide a an interpolator output signal by interpolating the digital signal, wherein the digital signal is based, at least in part, on the class D amplifier input signal; and
        a sample rate converter, including:
            a poly-phase interpolator from which two adjacent phases are computed per output sample of the poly-phase interpolator, wherein the poly-phase interpolator is arranged to receive the interpolator output signal as an input;
            a linear interpolator that is arranged to perform linear interpolation between the two adjacent phases; and
            a phase control circuit that is arranged to control the poly-phase interpolator and the linear interpolator such that the linear interpolator outputs a sample rate converter output signal such that the sampling rate of the sample rate converter output signal has a sampling rate that is greater than a sampling rate of the interpolator output signal by an SRC factor, wherein the SRC factor is greater than one and less than two, and wherein the class D controller output signal is based, at least in part, on the sample rate converter output signal.

2. The circuit of claim 1, wherein
the class D controller further includes a modulator that is arranged to perform modulation on a modulator input signal to provide the class D controller output signal, wherein the modulator input signal is based, at least in part, on the sample rate converter output signal.

3. The circuit of claim 1, wherein
the interpolator is arranged such that the interpolator has an over-sampling ratio that is adjustable.

4. The circuit of claim 1, wherein
the phase control circuit is arranged to control the poly-phase interpolator by providing a phase selection signal based on the factor, and based on an over-sampling ratio of the poly-phase interpolator, and to control the linear interpolator by providing an interpolation factor signal based on the factor, and further based on the over-sampling ratio of the poly-phase interpolator,
the poly-phase interpolator is arranged to determined which two adjacent samples to provide based on the phase selection signal, and
wherein the linear interpolation circuit is arranged to linearly interpolate between the two adjacent phases based on the interpolation factor signal.

5. The circuit of claim 4, wherein
the linear interpolation circuit is arranged to provide the sample rate converter output signal such that the sample rate converter output signal is a multi-bit digital signal having a value y as substantially given by $y=a+\alpha*(b-a)$, where "$\alpha$" represents a value of the interpolation factor signal, "a" represents a value of a first of the two adjacent samples, and "b" represents a value of a second of the two adjacent samples.

6. The circuit of claim 4, wherein
the phase control circuit is arranged to provide the phase selection signal and the interpolation factor signal by performing actions, including:
    calculating an accumulated value "P", wherein the accumulated value P is determined as follows:
        initializing P at zero,
        for each output sample:
            adding M and P to provide a sum, wherein the SRC factor is equal to a ration of L:M, L is an integer, and M is an integer;

performing a modulo L operation on the sum, wherein the result of the modulo L operation is the calculated as a new value for "P";
providing the integer portion of "P" as φsel, where φsel is a value of the phase selection signal; and
providing the fractional portion of P as a, where a is a value of the interpolation factor signal.

7. A circuit for amplification, comprising:
a class D controller that is arranged to receive a class D amplifier input signal and to provide a class D controller output signal, wherein the class D controller includes:
  a pulse width modulation circuit that is arranged to receive a pulse width modulation input signal, and to provide a pulse width modulation output signal, wherein the pulse width modulation input signal is based, at least in part, on the class D amplifier input signal; the pulse width modulation output signal is a multi-bit, digital signal; and wherein the pulse width modulation circuit is arranged to provide the pulse width modulation output signal by performing pulse width modulation on the pulse width modulation input signal;
  a sigma-delta modulation circuit that is arranged to provide a sigma-delta modulation output signal by performing sigma-delta modulation on the pulse width modulation output signal, wherein the order of the sigma-delta modulation is programmable; at least one of the programmable orders of the sigma-delta modulation is greater than second order; and wherein the sigma-delta modulation output signal is a multi-bit, digital signal; and
  a pulse generation circuit that is arranged to provide a pulse width modulation pulse signal that is based on the sigma-delta modulation output signal such that pulse width modulation pulse signal has a series of pulses such that the width each pulse is determined based on the value of the sigma-delta modulation output signal.

8. The circuit of claim 7, wherein
the sigma-delta modulation circuit is arranged such that at least one of the programmable orders of the sigma-delta modulation is three.

9. The circuit of claim 7, wherein
the sigma-delta modulation circuit is arranged such that at least one of the programmable orders of the sigma-delta modulation is four.

10. The circuit of claim 7, wherein
the sigma-delta modulation circuit is arranged such that the programmable orders of the sigma-delta modulation include at least two, three, four, and five.

11. The circuit of claim 7, wherein
the pulse width modulation circuit is arranged to provide the pulse width modulation signal as a multi-bit, digital signal that is a pulse-code modulated (PCM) signal,
the sigma-delta modulation circuit is arranged to provide the sigma-delta modulation output signal such that the sigma-delta modulation output signal is a multi-bit, digital signal that is another PCM signal, and
wherein the pulse generation circuit is arranged to provide the pulse signal by converting the sigma-delta modulation output signal from a PCM signal to a pulse-width modulated (PWM) signal.

12. A circuit for amplification, comprising:
a class D controller that is arranged to receive a class D amplifier input signal and to provide a class D controller output signal, wherein the class D controller includes:
  an interpolator that is arranged to receive a digital signal, and to provide a an interpolator output signal by interpolating the digital signal, wherein the digital signal is based, at least in part, on the class D amplifier input signal;
  a sample rate converter that is arranged to provide a sampling rate output signal from the interpolator output signal such that the sample rate converter output signal has a sampling rate that is greater than a sampling rate of the interpolator output signal by a factor, wherein the factor is greater than one and less than two;
  a pulse width modulation circuit that is arranged to receive a pulse width modulation input signal, and to provide a pulse width modulation output signal, wherein the pulse width modulation input signal is based, at least in part, on the sampling rate converter output signal; the pulse width modulation output signal is a multi-bit, digital signal; and wherein the pulse width modulation circuit is arranged to provide the pulse width modulation output signal by performing pulse width modulation on the pulse width modulation input signal;
  a sigma-delta modulation circuit that is arranged to provide a sigma-delta modulation output signal by performing sigma-delta modulation on the pulse width modulation output signal, wherein the order of the sigma-delta modulation is programmable; at least one of the programmable orders of the sigma-delta modulation is greater than second order; and wherein the sigma-delta modulation output signal is a multi-bit, digital signal; and
  a pulse generation circuit that is arranged to provide a pulse width modulation pulse signal that is based on the sigma-delta modulation output signal such that pulse width modulation pulse signal has a series of pulses such that the width each pulse is determined by the value of the sigma-delta modulation output signal.

13. The circuit of claim 12, further comprising:
a class D driving unit that is arranged to provide a class D amplifier output signal from the pulse signal, wherein the class D driver unit includes a plurality of drivers and a plurality of power switches that are arranged to provide a class D output, the class D controller and the class D driving unit are arranged to operate together as a class D amplifier; and wherein the class D controller further includes:
  a memory management unit client that is arranged to receive the class D amplifier input signal, and to provide the digital signal based, in part, on the class D amplifier input signal; and
  a digital gain block that is arranged to receive the sampling rate conversion output signal, and to provide the pulse width modulation input signal by providing digital gain to the sampling rate conversion output signal.

14. The circuit of claim 12, wherein
the sigma-delta modulation circuit is arranged such that the programmable orders of the sigma-delta modulation include at least three and four.

15. The circuit of claim 12, wherein
the pulse width modulation circuit is arranged to provide the pulse width modulation signal as a multi-bit, digital signal that is a pulse-code modulated (PCM) signal,
the sigma-delta modulation circuit is arranged to provide the sigma-delta modulation output signal such that the sigma-delta modulation output signal is a multi-bit, digital signal that is another PCM signal, and wherein the pulse generation circuit is arranged to provide the pulse signal by converting the sigma-delta modulation output signal from a PCM signal to a pulse-width modulated (PWM) signal.

16. The circuit of claim 12, wherein the pulse width modulation performs pulse width modulation having an adjustable pulse-width modulation rate;

the interpolator is arranged such that the interpolator has an over-sampling ratio that is adjustable, and wherein the adjustable over-sampling ratio of the interpolator is linked with the adjustable pulse-width modulation rate.

17. The circuit of claim 12, wherein the sample rate converter includes:
- a poly-phase interpolator from which two adjacent phases are computed per output sample of the poly-phase interpolator, wherein the poly-phase interpolator is arranged to receive the interpolator output signal as an input;
- a linear interpolator that is arranged to perform linear interpolation on the adjacent phases output by the poly-phase interpolator; and
- a phase control circuit that is arranged to control the poly-phase interpolator and the linear interpolator such that the linear interpolator outputs a sample rate converter output signal such that the sampling rate of the sample rate converter output signal has a sampling rate that is greater than a sampling rate of the interpolator output signal by an SRC factor, wherein the SRC factor is greater than one and less than two, and wherein the class D controller output signal is based, at least in part, on the sample rate converter output signal.

18. The circuit of claim 17, wherein the phase control circuit is arranged to control the poly-phase interpolator by providing a phase selection signal based on the factor, and based on an over-sampling ratio of the poly-phase interpolator, and to control the linear interpolator by providing an interpolation factor signal based on the factor, and based on the over-sampling ratio of the poly-phase interpolator, the poly-phase interpolator is arranged to determined which two adjacent samples to provide based on the phase selection signal, and wherein the linear interpolation circuit is arranged to linearly interpolate between the two adjacent phases based on the interpolation factor signal.

19. The circuit of claim 18, wherein the linear interpolation circuit is arranged to provide the sample rate converter output signal such that the sample rate converter output signal is a multi-bit digital signal having a value y as substantially given $y=a+\alpha*(b-a)$, where "$\alpha$" represents a value of the interpolation factor signal, "a" represents a value of a first of the two adjacent samples, and "b" represents a value of a second of the two adjacent samples.

20. The circuit of claim 18, wherein the phase control circuit is arranged to provide the phase selection signal and the interpolation factor signal by performing action, including:

calculating an accumulated value "P", wherein the value P is determined as follows;
  initializing "P" at zero;
  for each output sample:
    adding M and P to provide a sum, wherein the SRC factor is equal to a ration of L:M, L is an integer, and M is an integer;
    performing a modulo L operation on the sum, wherein the result of the modulo L operation is the calculated as a new value for "P";
  providing the integer portion of "P" as $\phi$sel, where $\phi$sel is a value of the phase selection signal; and
  providing the fractional portion of P as $\alpha$, where $\alpha$ is a value of the interpolation factor signal.

* * * * *